United States Patent
Nawa et al.

(10) Patent No.: US 10,407,604 B2
(45) Date of Patent: Sep. 10, 2019

(54) HEAT-DISSIPATING RESIN COMPOSITION, AND COMPONENT AND ELECTRONIC DEVICE INCLUDING THE SAME

(71) Applicant: Panasonic Intellectual Property Management Co., Ltd., Osaka (JP)

(72) Inventors: Honami Nawa, Osaka (JP); Hirohisa Hino, Osaka (JP); Arata Kishi, Osaka (JP); Naomichi Ohashi, Hyogo (JP); Yasuhiro Suzuki, Osaka (JP); Hidenori Miyakawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 70 days.

(21) Appl. No.: 14/706,349

(22) Filed: May 7, 2015

(65) Prior Publication Data

US 2015/0327393 A1 Nov. 12, 2015

(30) Foreign Application Priority Data

May 9, 2014 (JP) .................................. 2014-097292

(51) Int. Cl.

| C09K 5/14 | (2006.01) |
|---|---|
| C08L 23/16 | (2006.01) |
| C09D 123/16 | (2006.01) |
| C08K 3/34 | (2006.01) |
| H05K 7/20 | (2006.01) |
| C08L 91/00 | (2006.01) |

(52) U.S. Cl.
CPC .................. C09K 5/14 (2013.01); C08K 3/34 (2013.01); C08L 23/16 (2013.01); C09D 123/16 (2013.01); H05K 7/205 (2013.01); C08K 2201/003 (2013.01); C08K 2201/016 (2013.01); C08L 91/00 (2013.01)

(58) Field of Classification Search
CPC .......... H01B 7/42; H01B 7/421; H01B 7/428; H01B 17/54; H01B 3/025; H01B 3/10; H01B 3/12; H01B 3/28; H01B 3/30; H01B 3/307; H01B 3/47; H01B 1/20; H01B 1/22; H01B 1/24; C08L 23/08; C08L 23/0807; C08L 23/0815; C08L 23/0823; C08L 23/083; C08L 23/0838; C08L 23/0846; C08L 23/10; C08L 23/14; C08L 23/142; C08L 23/145; C08L 23/16; C08L 23/18; C08L 23/20; C08L 23/22; C08L 23/24; C08L 91/00; C08L 91/005; C08L 91/02; C08L 91/04; C08L 91/06; C08L 91/08; C09K 5/14; C08K 3/34; C08K 2201/003; C08K 2201/004; C08K 2201/005; C08K 2201/016; H05K 7/205; C09D 123/04; C09D 123/06; C09D 123/08; C09D 123/0807; C09D 123/0815; C09D 123/0823; C09D 123/083; C09D 123/10; C09D 123/12; C09D 123/14; C09D 123/142; C09D 123/145; C09D 123/16

USPC .......... 252/500, 501.1, 519.1, 519.3, 519.32, 252/519.33, 71, 73, 74; 361/704, 705, 361/706, 708

See application file for complete search history.

(56) References Cited

U.S. PATENT DOCUMENTS

| 4,038,042 | A | * | 7/1977 | Adelman ................. C08K 3/04 205/158 |
|---|---|---|---|---|
| 4,720,424 | A | * | 1/1988 | Eickman .............. C08G 63/605 257/788 |
| 5,231,128 | A | * | 7/1993 | Nakata ..................... C08K 3/34 524/442 |
| 7,786,216 | B2 | * | 8/2010 | Soediono ............ C08L 23/0815 525/191 |
| 2011/0301278 | A1 | * | 12/2011 | Sannomiya ............. C08L 23/16 524/506 |
| 2012/0077040 | A1 | * | 3/2012 | Park ......................... C09D 1/00 428/415 |
| 2013/0053503 | A1 | * | 2/2013 | Lima ...................... C08L 77/06 524/514 |

FOREIGN PATENT DOCUMENTS

| CN | 101402763 | | 4/2009 |
|---|---|---|---|
| JP | 2012-144687 | | 8/2012 |
| JP | 2013147542 A | * | 8/2013 |

OTHER PUBLICATIONS

English machine translation of Imai, JP 2013-147542 A (2013).*
English machine translation of Imai, JP 2012-144687 A (2012).*
Yu et al. (Preparation of leafing Cu and its application in low infrared emissivity coatings Journal of Alloys and Compounds, 484, pp. 395-399, 2009).*
Parker et al. ("Laboratory Testing of the Reflectance Properties of Roofing Material" FSEC-CR-670-00. Florida Solar Energy Center, Cocoa, FL, 2000).*

(Continued)

*Primary Examiner* — Harold Y Pyon
*Assistant Examiner* — Matthew R Diaz
(74) *Attorney, Agent, or Firm* — Wenderoth, Lind & Ponack, L.L.P.

(57) ABSTRACT

Provided is a heat-dissipating resin composition including: a rubber material having an average emissivity of 80% or higher in a wavelength range from 5 μm to 20 μm; and a filler having a grain diameter of 15 μm or smaller and an aspect ratio of 3 to 10, wherein the heat-dissipating resin composition has an emissivity of 90% or higher in the wavelength range from 5 μm to 20 μm.

16 Claims, 5 Drawing Sheets

(56) References Cited

OTHER PUBLICATIONS

Environmental Responsiveness EPDM Roofing Association Webpage (https://web.archive.org/web/20120804215802/http://www.epdmroofs.org/what-is-epdm/why-epdm/environmental-responsiveness, obtained through WaybackMachine dated Aug. 4, 2012).*
Chinese Office Action dated Jul. 3, 2018 in corresponding Chinese Patent Application No. 201510232265.9, with English language translation of search report.

* cited by examiner

HEAT-DISSIPATING RESIN COMPOSITION, AND COMPONENT AND ELECTRONIC DEVICE INCLUDING THE SAME

CROSS REFERENCE TO RELATED APPLICATION

The present application is based on and claims priority of Japanese Patent Application No. 2014-097292 filed on May 9, 2014. The entire disclosure of the above-identified application, including the specification, drawings and claims is incorporated herein by reference in its entirety.

BACKGROUND OF THE INVENTION

1. Field of the Invention

The present disclosure relates to a heat-dissipating resin composition, and particularly to a heat-dissipating resin composition that dissipates heat of a heat-generating element to the outside, and a component and an electronic device including the heat-dissipating resin composition.

2. Description of the Related Art

Recent mobile electronic devices such as smartphones and tablet PCs are prone to heat up as CPUs become faster. Conventional methods for cooling heat-generating devices include transferring heat of a heat-generating device into a heat sink connected to the heat-generating device. Furthermore, the methods also include dissipating heat from a heat sink by convection by providing air flow from a fan to the heat sink.

However, it is difficult to include such fans or heat sinks in smaller, lighter, and thinner smartphones and tablet PCs. Thus, the major problem herein is how to dissipate heat.

One of the solutions is to apply a heat-dissipating resin composition to a surface of a heat-generating device to dissipate heat. Many heat-dissipating resin compositions are highly filled with alumina of a higher thermal conductivity. Highly filling heat-dissipating resin compositions with alumina and evenly dissipating heat increase the heat dissipation ability (Japanese Unexamined Patent Application Publication No. 2012-144687 hereinafter referred to as Patent Literature (PTL) 1).

SUMMARY OF THE INVENTION

Figure 7:
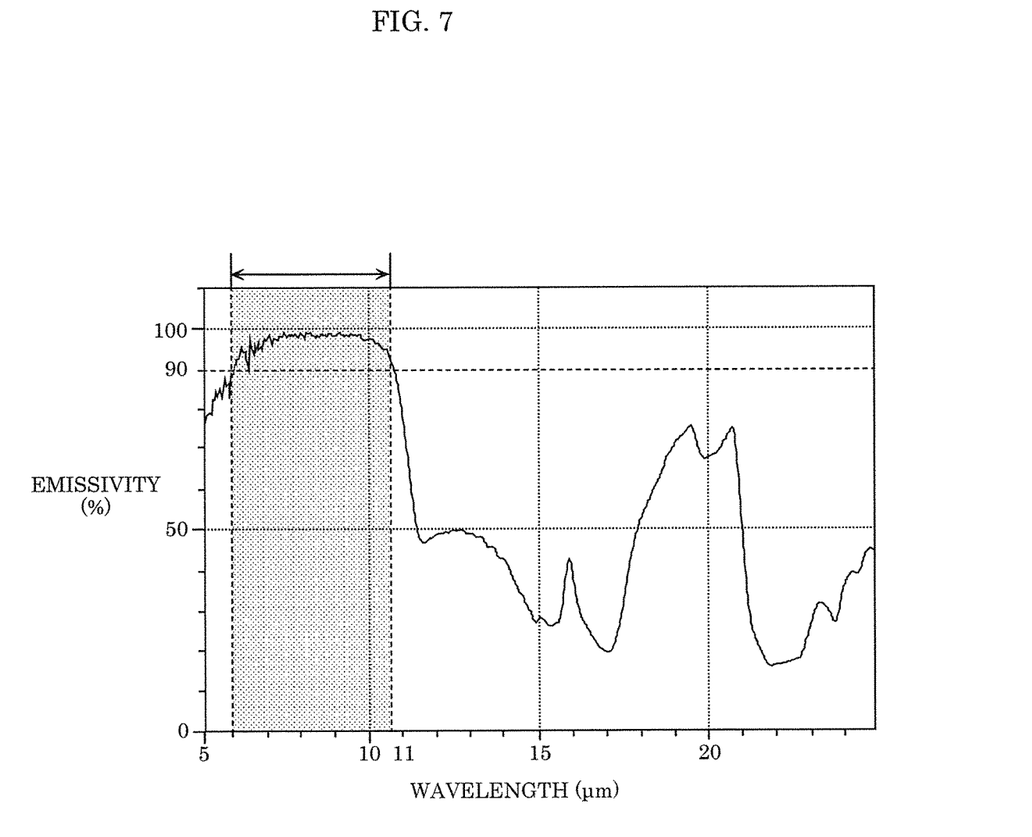
FIG. 7 graphs the measurement results of emissivities of alumina according to PTL 1.

FIG. 7 graphs a relationship between wavelengths and emissivities of alumina. As graphed in FIG. 7, only a wavelength range from 6 μm to 11 μm has 90% or higher emissivities. The other wavelength ranges have lower emissivities. Thus, even when the heat-dissipating resin compositions are highly filled with fillers made of alumina, the heat dissipation is inefficient. Here, efficient heat dissipation requires higher emissivities in an entire far-infrared wavelength range.

When fillers of higher emissivities are mixed into the heat-dissipating resin compositions in a wavelength range longer than 11 μm, the emissivities of the heat-dissipating resin compositions in the wavelength range from 6 μm to 11 μm adversely become lower.

The present disclosure has been conceived to solve the conventional problems, and the object of the present disclosure is to provide, for example, a heat-dissipating resin composition having a higher emissivity in a wider wavelength range.

In one general aspect, the techniques disclosed here feature the heat-dissipating resin composition including: a rubber material having an average emissivity of 80% or higher in a wavelength range from 5 μm to 20 μm; and a filler having a grain diameter of 15 μm or smaller and an aspect ratio of 3 to 10, wherein the heat-dissipating resin composition has an emissivity of 90% or higher in the wavelength range from 5 μm to 20 μm.

This heat-dissipating resin composition exhibits an extremely high emissivity in a wider far-infrared wavelength range from 5 μm to 20 μm. Also the aspect ratio of the filler included in this heat-dissipating resin composition enhances handleability of this heat-dissipating resin composition.

Furthermore, application of the heat-dissipating resin composition to a heat-generating element enables efficient conversion of heat generated from a heat-generating element into far-infrared and dissipation of the heat into the air. As a result, the thermal energy of the heat-generating element can be reduced, and the temperature rise in a heat-generating device can be suppressed.

This method produces an advantage in suppressing the temperature rise without using any fan or heat sink.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE PREFERRED EMBODIMENT

An embodiment of a heat-dissipating resin composition will be described hereinafter.

<Heat-Dissipating Resin Composition 1>

Figure 1:
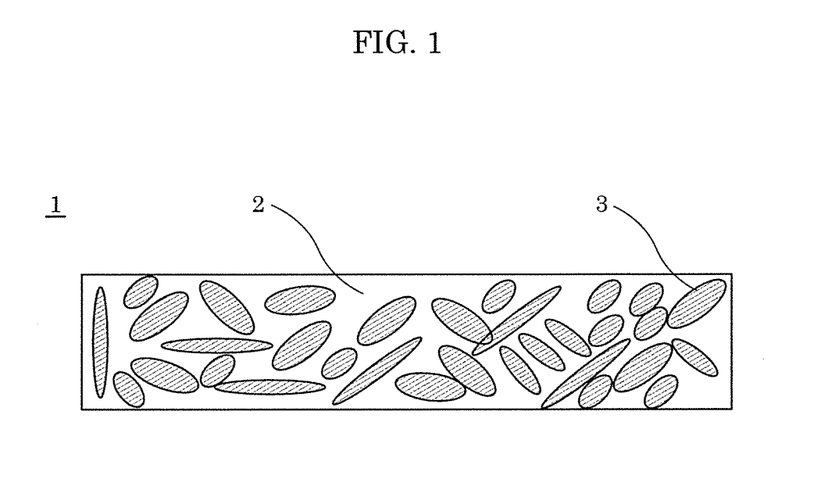
FIG. 1 is a cross-sectional view of a heat-dissipating resin composition according to an embodiment.

Heat-dissipating resin composition 1 according to the embodiment will be described hereinafter. FIG. 1 is a cross-sectional view of heat-dissipating resin composition 1.

Heat-dissipating resin composition 1 contains resin 2 and fillers 3.

Resin 2 may be a rubber material having an average emissivity of 80% or higher in a wavelength range from 5 μm to 20 μm. Examples of the rubber material include a non-conjugated polyene copolymer rubber. Examples of the non-conjugated polyene copolymer rubber include a liquid ethylene-propylene terpolymer (EPT). The liquid EPT is an ethylene/propylene/non-conjugated polyene copolymer rubber.

Filler 3 may be a filler having a grain diameter of 15 μm or smaller and an aspect ratio of 3 to 10. Examples of the filler include cordierite.

Heat-dissipating resin composition 1 containing resin 2 and fillers 3 has an emissivity of 90% or higher in the wavelength range from 5 μm to 20 μm.

<Resin 2>

Resin 2 is a liquid EPT according to the embodiment. The liquid EPT can be thermally cured at a low temperature. The liquid EPT suitably has an average emissivity of 80% or higher in a wavelength range from 5 μm to 20 μm. The liquid EPT suitably has an emissivity of 80% or higher in a total wavelength range from 5 μm to 20 μm. The reasons will be described below.

The wavelength range from 5 μm to 20 μm is effective at dissipating heat. Furthermore, a mixture of resin 2 and fillers 3 is greatly influenced by an emissivity of resin 2. When resin 2 singly has an emissivity lower than 80% in the wavelength range from 5 μm to 20 μm, the emissivity of the mixture containing fillers 3 does not exceed 90%, and the heat dissipation is inefficient.

The liquid EPT is expressed by chemical formula 1 below.

[Chemical 1]

(In chemical formula 1, R1 denotes an alkyl group having a carbon number of 1 to 5, R2 denotes an allyl group having a carbon number of 2 to 5, and n, m, and l are natural numbers.)

The molecular mass of the liquid EPT suitably ranges from 750 to 2000. Particularly, it is suitable that the molecular masses of n and m range from 3 to 10 and the molecular mass of l ranges from 5 to 8 in chemical formula 1.

When the molecular mass of the liquid EPT is smaller than 750, resin 2 becomes low-viscosity. Furthermore, when heat-dissipating resin composition 1 is applied to a substrate, resin 2 flows out. As a result, resin 2 has poor handleability.

Furthermore, when the molecular mass of the liquid EPT is larger than 2000, resin 2 becomes high-viscosity, heat-dissipating resin composition 1 cannot be highly filled with fillers 3, and the heat is not efficiently dissipated.

<Crosslinker>

Triallyl isocyanurate (TAIC™ manufactured by Nippon Kasei Chemical Co., Ltd) that is a crosslinker, and a derivative of TAIC™ may be added to improve the adhesiveness. The crosslinker is an agent for improving crosslinking efficiency. According to the embodiment, the crosslinker can improve the adhesiveness of heat-dissipating resin composition 1 to a substrate as well as the general crosslinking efficiency.

The crosslinker suitably accounts for 0.5% to 0.8% of the liquid EPT serving as a main resin by mass. The reasons will be described below.

When the crosslinker accounts for less than 0.5% of the liquid EPT by mass, the adhesiveness of heat-dissipating resin composition 1 cannot be increased. When the crosslinker accounts for more than 0.8% of the liquid EPT by mass, although the adhesiveness is increased, the tackiness of the surface of heat-dissipating resin composition 1 increases, and thus heat-dissipating resin composition 1 may have poor handleability.

<Plasticizer>

The amount of fillers 3 can be increased by adding a hydrocarbon oil that is a plasticizer, for example, LUCANT HC40, HC100, and HC150 manufactured by Mitsui Chemicals, Inc. Addition of the plasticizer can enhance the wettability between fillers 3 and resin 2, and reduce the viscosity of the mixture of resin 2 and fillers 3. The plasticizer suitably accounts for 10% to 20% of the liquid EPT by mass. The reasons will be described below.

When the plasticizer accounts for less than 10% of the liquid EPT by mass, it is probable that the paste resin becomes high-viscosity and cannot be highly filled with fillers 3. When the plasticizer accounts for more than 20% of the liquid EPT by mass, the paste resin becomes low-viscosity and can be highly filled with fillers 3 in kneading resin 2 and fillers 3. However, since the thixotropy of the paste resin is low, the adhesiveness of heat-dissipating resin composition 1 may decrease.

<Thixotropic Agent>

Addition of a thixotropic agent is effective at preventing precipitation of fillers 3 filled when resin 2 is thermally cured. Examples of the thixotropic agent include AEROSIL RY 200 that is manufactured by NIPPON AEROSIL CO., LTD. and is hydrophobic colloidal silica. Addition of a thixotropic agent can increase the thixotropy of resin 2 to fillers 3 and prevent precipitation of fillers 3.

Thus, fillers 3 can be distributed on the surface of the resin layer, and increase the emissivities across heat-dissipating resin composition 1. The thixotropic agent suitably accounts for 0.5% to 0.8% of the liquid EPT by mass. The reasons will be described below.

When the thixotropic agent accounts for less than 0.5% of the liquid EPT by mass, the structure of the thixotropic agent is changed in such a manner that the thixotropy of the paste resin hardly increases, fillers 3 precipitate while the paste resin is being cured, and the heat dissipation is inefficient. When the thixotropic agent accounts for more than 0.8% of the liquid EPT by mass, the thixotropy of the paste resin is so high that the thixotropic agent may have poor handleability in preparing the paste resin.

<Amounts of Resin 2 and Fillers 3>

Resin 2 suitably accounts for 10% to 65% of heat-dissipating resin composition 1 by volume. Here, fillers 3 constitute 35% to 90% of heat-dissipating resin composition 1 by volume.

The reasons will be described below.

When the amount of resin 2 is smaller than 10% of heat-dissipating resin composition 1 by volume assuming that the amounts of resin 2+fillers 3=100% by volume, the amount of fillers 3 is more than or equal to 90% of heat-dissipating resin composition 1 by volume, and it becomes difficult to thinly apply the resin paste to a heat-generating device. In other words, resin 2 may have poor handleability.

Conversely, when the amount of resin 2 is larger than 65% of heat-dissipating resin composition 1 by volume, the amount of fillers 3 is less than or equal to 35% of heat-dissipating resin composition 1 by volume, fillers 3 cannot be distributed to the surface of the resin layer, and the heat dissipation is inefficient. Thus, it would be better that the amount of fillers 3 accounts for at least 35% to 90% of heat-dissipating resin composition 1 by volume.

<Fillers 3>

Fillers 3 may mainly contain cordierite having a higher far-infrared emissivity according to the embodiment.

Cordierite is a mineral of $2MgO \cdot 2Al_2O_3 \cdot 5SiO_2$ having a higher emissivity in a wavelength range from 11 μm to 18 μm.

Each of fillers 3 suitably has a grain diameter smaller than or equal to 15 μm and an aspect ratio of 3 to 10.

When the grain diameter of fillers 3 exceeds 15 μm and the resin paste is applied to a heat-generating device, fillers 3 may protrude, or heat-dissipating resin composition 1 cannot be highly filled fillers 3 because the grains have gaps in-between.

Furthermore, when the aspect ratio of fillers 3 is smaller than 3, since the grains are substantially spherical, fillers 3 precipitate while heat-dissipating resin composition 1 is thermally cured, and the heat dissipation is inefficient on the surface of the resin layer.

Thus, the emissivity of the cured surface decreases, and the heat is inefficiently dissipated. When the aspect ratio of fillers 3 is larger than 10, the wettability between fillers 3 and resin 2 decreases due to the increased area of fillers 3, and the workability in preparing the paste resin decreases.

Thus, fillers 3 suitably have superior radiation properties of far-infrared. Specifically, as long as fillers 3 radiate far-infrared substantially at black-body energy levels (having higher than or equal to 90% of emissivity in a wavelength range from 5 μm to 20 μm) in a temperature range from 75° C. to 150° C., fillers 3 when concurrently used with cordierite can exhibit the superior radiation properties of far-infrared in a heat-dissipating resin composition.

The amount of fillers 3 suitably accounts for 35% to 90% of heat-dissipating resin composition 1 by volume.

Surface treatment such as coupling treatment may be performed on fillers 3 to increase the adhesiveness and the wettability of resin 2, or a dispersing agent or others may be added to fillers 3 so that the dispersibility of fillers 3 into heat-dissipating resin composition 1 increases.

Examples of the present disclosure will be specifically described hereinafter. The examples do not limit the scope of the present disclosure.

EXAMPLES

Table 1 indicates paste compositions of heat-dissipating resin compositions that were used in Examples and Comparative examples below.

TABLE 1

| | COMPOSITION | CONTENT | EXAMPLE 1 | EXAMPLE 2 | EXAMPLE 3 | EXAMPLE 4 | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|---|---|---|---|---|---|
| RESIN COMPONENT | EPT (MAIN RESIN)*[1] | PX-068 | 26.9 | 8.1 | 8.7 | 20.0 | NO APPLICATION OF RESIN | 8.1 | 8.1 | 5.5 | |
| | CROSSLINKER OF EPT*[2] | X93-916 | 2.73 | 0.8 | 0.9 | 2.0 | | 0.82 | 0.82 | 0.56 | |
| | | TAIC CROSSLINKER | | | | 0.1 (0.5) | | | | | |
| | REACTION INHIBITOR*[3] | X93-1036 | 0.16 | 0.05 | 0.05 | 0.12 | | 0.05 | 0.05 | 0.03 | |
| | COUPLING AGENT*[4] | KBM-1003 | 0.11 | 0.03 | 0.03 | 0.08 | | 0.03 | 0.05 | 0.02 | |
| | CATALYST FOR EPT*[5] | Pt-CTSCTS | 0.04 | 0.01 | 0.01 | 0.03 | | 0.01 | 0.01 | 0.01 | |
| | PLASTICIZER*[6] | LUCANT HC40 | 3.2 | 0.96 | | 2.4 | | 0.96 | 0.96 | 0.66 | |
| | SURFACE PREPARATION AGENT*[7] | RHEODOL SP-030V | | | 0.58 | | | | | | |
| | EPOXY RESIN*[8] | RIKARESIN HBE-100DME-100 | | | | | | | | | 5.0 |
| | CURATIVE*[9] | B650 | | | | | | | | | 4.2 |
| | EPOXY CATALYST*[10] | U-CAT SA 5005 | | | | | | | | | 0.09 |
| | THIXOTROPIC AGENT*[11] | AEROSIL RY200 | | | | 0.1 (0.5) | | | | | |
| FILLER COMPONENT | CORDIERITE*[12] | SS-200 | 67 | | 60 | | | | | | |
| | | SS-1000 | | 90 | 30 | 75 | | | | | |
| | | SS-F30 | | | | | | 90 | | | |
| | | SS-Sul | | | | | | | 90 | | |
| | ALUMINA*[13] | DAW45 | | | | | | | | 95 | 91 |
| FILLER CONCENTRATION | FILLER CONCENTRATION | | 67 | 90 | 90 | 75 | | 90 | 90 | 95 | 91 |
| EVALUTION | FAR-INFRARED EMISSIVITY (—) | WAVELENGTH 5 μm | 0.9 | 0.92 | 0.92 | 0.92 | | 0.85 | 0.8 | 0.7 | 0.7 |
| | | WAVELENGTH 15 μm | 0.92 | 0.95 | 0.92 | 0.95 | | 0.8 | 0.78 | 0.88 | 0.8 |
| | | WAVELENGTH 20 μm | 0.9 | 0.94 | 0.9 | 0.94 | | 0.75 | 0.77 | 0.85 | 0.82 |
| | | EVALUATION MARK | ✓ | ✓ | ✓ | ✓ | | x | x | x | x |

TABLE 1-continued

|  | |  | EXAMPLE | | | | COMPARATIVE EXAMPLE | | | | |
| --- | --- | --- | --- | --- | --- | --- | --- | --- | --- | --- | --- |
| COMPOSITION | CONTENT | | 1 | 2 | 3 | 4 | 1 | 2 | 3 | 4 | 5 |
| TEMPERATURE-RISE SUPPRESSION EFFECT | TEMPERATURE (ΔT) | | 21 | 25 | 30 | 32 | 5 | 15 | 13 | 10 | 8 |
| | TEMPERATURE-RISE SUPPRESSION RATE (%) | | 13.3 | 16.7 | 20.8 | 22.5 | 4.2 | 8.3 | 6.7 | 4.2 | 2.5 |
| | EVALUATION MARK | | ✓− | ✓− | ✓ | ✓ | — | x | x | x | x |
| COMPREHENSIVE EVALUATION MARK | | | ✓ | ✓ | ✓ | ✓+ | — | x | x | x | x |

(VALUE IN PARENTHESIS INDICATES PERCENTAGE OF EPT BASE BY MASS)
(COMPONENTS AND CONCENTRATIONS ARE INDICATED BY MASS %.)
x POOR
✓− ACCEPTABLE
✓ EXCELLENT
✓+ OUTSTANDING
[1] denotes an EPT serving as a main resin, namely, PX-068 manufactured by Mitsui Chemicals, Inc.
[2] denotes crosslinkers of EPT including X93-916 manufactured by Shin-Etsu Chemical Co., Ltd. and TAIC manufactured by Nippon Kasei Chemical Co., Ltd.
[3] denotes a reaction inhibitor, namely, X93-1036 manufactured by Shin-Etsu Chemical Co., Ltd.
[4] denotes a coupling agent, namely, KBM-1003 manufactured by Shin-Etsu Chemical Co., Ltd.
[5] denotes a catalyst for EPT, namely, Pt-CTSCTS manufactured by Mitsui Chemicals, Inc.
[6] denotes a plasticizer, namely, LUCANT HC40 manufactured by Mitsui Chemicals, Inc.
[7] denotes a surface preparation agent, namely, RHEODOL SP-030V manufactured by Kao Corporation.
[8] denotes epoxy resins, namely, RIKARESIN HBE-100 and DME-100 manufactured by New Japan Chemical Co., Ltd.
[9] denotes a curative, namely, B650 manufactured by DIC Corporation.
[10] denotes an epoxy catalyst, namely, U-CAT SA5003 manufactured by San-Apro Ltd.
[11] denotes a thixotropic agent, namely, AEROSIL RY 200 manufactured by NIPPON AEROSIL CO., LTD.
[12] denotes cordierite, namely, SS-200 (7.6 μm in grain diameter), SS-1000 (1.7 μm in grain diameter), SS-F30 (35 μm in grain diameter), and SS-Sul (150 μm in grain diameter) that are manufactured by MARUSU GLAZE Co., Ltd.
[13] denotes alumina, namely, DAW45 having 45 μm in grain diameter and manufactured by DENKI KAGAKU KOGYO KABUSHIKI KAISHA.

Example 1

An example of preparing heat-dissipating resin composition 1 illustrated in FIG. 1 will be described hereinafter.

The components in Table 1 were mixed and kneaded by a planetary mixer to prepare pastes. The pastes were applied with a thickness of 50 μm through a metal mask, and thermally cured at 80° C. in 30 minutes.

Figure 2:
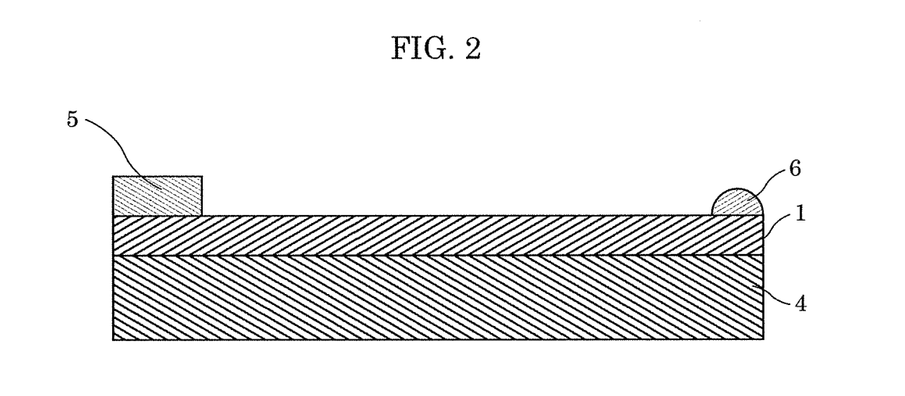
FIG. 2 is a cross-sectional view of an example coating structure according to Examples 1 to 4 and Comparative examples 2 to 5.

A heat-dissipating evaluation element in FIG. 2 was prepared to evaluate the heat dissipation ability. The heat-dissipating evaluation element includes heat-dissipating resin composition 1, metal substrate 4, heat-generating element 5, and thermocouple 6.

An aluminum substrate of 40 mm×100 mm×1 mm (thickness) was prepared as metal substrate 4. A ceramic heat-generating element having an area of 10 mm×10 mm as heat-generating element 5 was bonded to the center portion of the back side of metal substrate 4 on which heat-dissipating resin composition 1 has been applied, with a silicone thermal grease (G777 manufactured by Shin-Etsu Chemical Co., Ltd.). Furthermore, thermocouple 6 was fixed to an edge portion of heat-dissipating resin composition 1 with a temperature-resistant tape.

Examples 2 to 4

The heat-dissipating evaluation element in FIG. 2 was prepared by preparing heat-dissipating resin composition 1 according to each of Examples 2 to 4 in the same manner as Example 1.

Comparative Example 1

Figure 3:
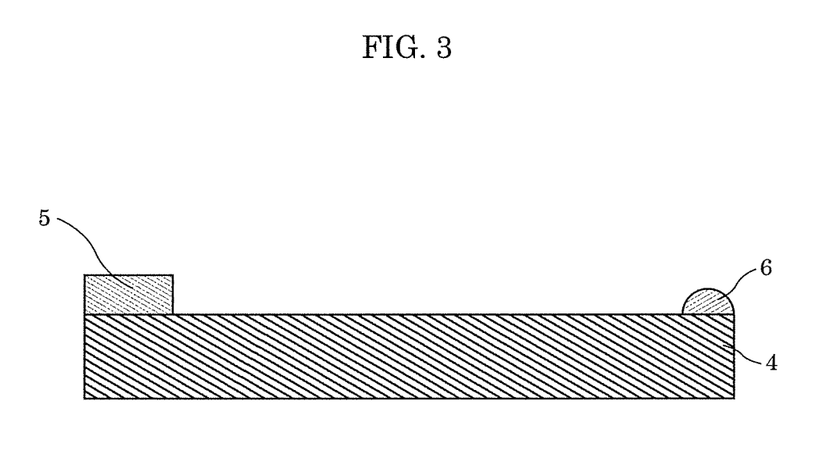
FIG. 3 is a cross-sectional view of an example coating structure according to Comparative example 1.

A heat-dissipating evaluation element in FIG. 3 was prepared without including heat-dissipating resin composition 1 according to Comparative example 1. The heat-dissipating evaluation element includes metal substrate 4, heat-generating element 5, and thermocouple 6.

Comparative Examples 2 to 5

The heat-dissipating evaluation element in FIG. 2 was prepared by preparing heat-dissipating resin composition 1 in the same manner as Example 1, according to each of Comparative examples 2 to 5.

Next, different nine heat-dissipating evaluation elements containing the components in Table 1 were measured for the far-infrared emissivity and the temperature-rise suppression effect. Each of the evaluation methods will be described hereinafter.

<Measurement of Far-Infrared Emissivity>

The heat-dissipating evaluation elements prepared in Examples and Comparative examples except Comparative example 1 were cut in squares of 25 mm×25 mm. These samples were set to a Fourier transform infrared spectrophotometer (abbreviated as FTIR, namely, IRPrestige-21 of Shimadzu Corporation). After the temperatures of these samples were increased to 100° C., the emissivities were measured using a blackbody furnace.

Figure 5:
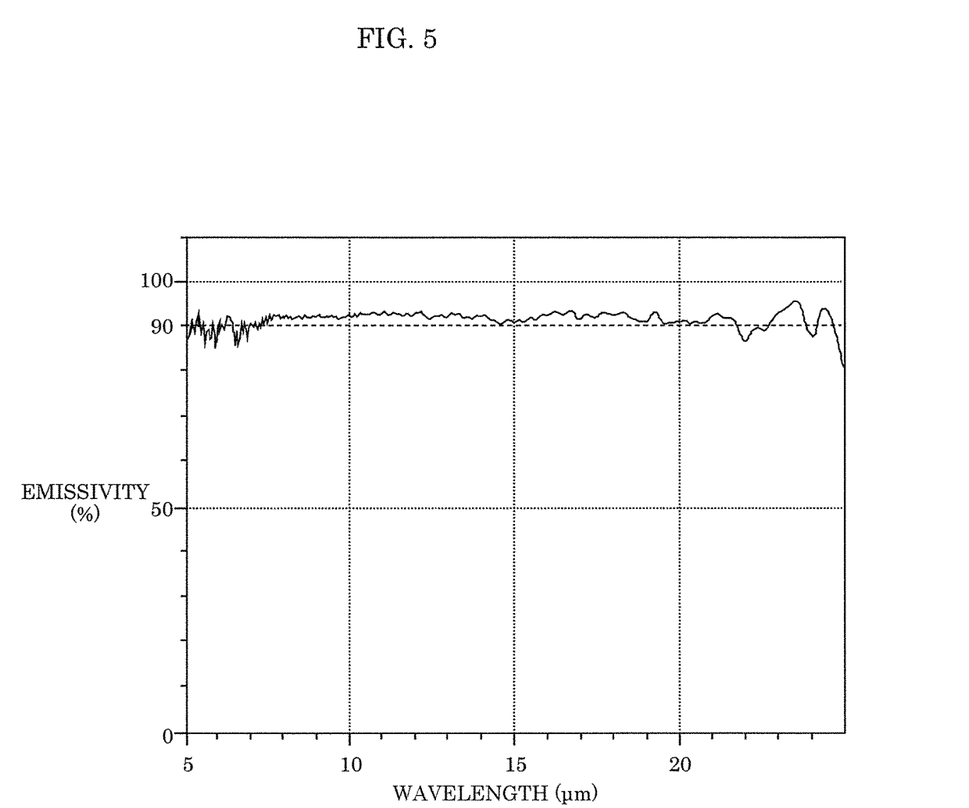
FIG. 5 graphs the measurement results of emissivities according to Example 1.

The wavelengths that greatly influence the heat dissipation ability range from 5 μm to 20 μm that are closer to the near infrared wavelength range included in the far-infrared wavelength range. Thus, the values in Table 1 were measured at the wavelengths of 5 μm, 15 μm, and 20 μm. FIG. 5 graphs the emissivity properties (a relationship between the wavelengths and the emissivities) according to Example 1.

The acceptability criterion on the emissivities was not to reach an average of the emissivities of the wavelength range from 5 μm to 20 μm but to reach or exceed 90% of emissivities in the entire wavelength range from 5 μm to 20 μm. The emissivities that satisfy this criterion in the entire wavelength range from 5 µm to 20 µm were indicated by check marks √. The emissivities that do not satisfy this criterion at one of the wavelengths of 5 µm, 15 µm, and 20 µm were indicated by check marks √−. Furthermore, the emissivities that do not satisfy this criterion in the entire wavelength range from 5 µm to 20 µm were indicated by x marks.

<Measurement of Temperature-Rise Suppression Effect>

The heat-dissipating evaluation elements obtained through Examples and Comparative examples were put to a temperature-controlled bath at 20° C., and a current passed through a ceramic heat-generating element without any wind. The temperature of a thermocouple was measured when the ceramic heat-generating element reached 120° C. by increasing the voltage, and a temperature difference ΔT was calculated according to Equation 1 below:

$$\Delta T=120°\ C.-(\text{Temperature of thermocouple}) \quad \text{(Equation 1)}.$$

With application of a heat-dissipating resin paste containing 67% of cordierite by weight in the liquid EPT to a metal substrate as described in Example 1, the temperature difference ΔT with 120° C. under the temperature control becomes 21° C. Furthermore, the temperature difference (ΔT) under the same conditions was no more than 5° C. without any application of the heat-dissipating resin paste in Comparative example 1. As a result of comparison between these two results, the temperature difference ΔT was calculated as ΔT=16° C.

Here, the temperature-rise suppression rate is expressed by Equation 2 below:

$$\text{Temperature-rise suppression rate}=[\Delta T-5°\ C.(\Delta T \\ \text{without any application of the heat-dissipating} \\ \text{resin paste})]/120°\ C.(\text{measured temperature of} \\ \text{the ceramic heat-generating element}) \quad \text{(Equation 2)}.$$

Since many of the heat-dissipation coatings had around 10% of the temperature-rise suppression rates, each of the evaluation marks was put based on the following criteria: x indicating lower than 10%, √− indicating higher than 10%, and √ indicating higher than 20% of the temperature-rise suppression rates.

Higher temperature-rise suppression rates are more suitable, and particularly, 10% or higher temperature-rise suppression rates were accepted. Depending on the application, when the temperature-rise suppression rates are lower than 10%, application of the paste is ineffective in terms of the cost.

<Comprehensive Evaluation on Heat Dissipation Ability>

The mark √+ indicates the acceptability of the heat dissipation ability in measurement of both the far-infrared emissivity and the temperature-rise suppression effect. Furthermore, when any one of the far-infrared emissivity and the temperature-rise suppression effect is marked with x, the comprehensive evaluation was also marked with x. The other cases were marked with √.

<Study of Table 1>

As clarified from the results of Table 1, the heat-dissipating resin compositions according to Examples exhibit higher emissivities and the heat dissipation ability than those of Comparative examples.

Furthermore, as a result of Examples 1 to 4, a filler concentration (concentration of cordierite) may range from 67% to 90% by mass.

As indicated in Example 4, addition of 0.5% by mass of TAIC that is a crosslinker of the liquid EPT in preparing the paste improved the adhesiveness to the metal substrate, thus increasing the temperature-rise suppression rates.

Furthermore, 0.5% by mass of AEROSIL RY 200 that is manufactured by NIPPON AEROSIL CO., LTD. and is hydrophobic colloid silica was added to the liquid EPT. Accordingly, the flowing out of the paste when applied to a substrate and the precipitation of the fillers when the paste was thermally cured can be prevented, thus increasing the workability.

<Grain Diameter of Cordierite Fillers>

Figure 6:
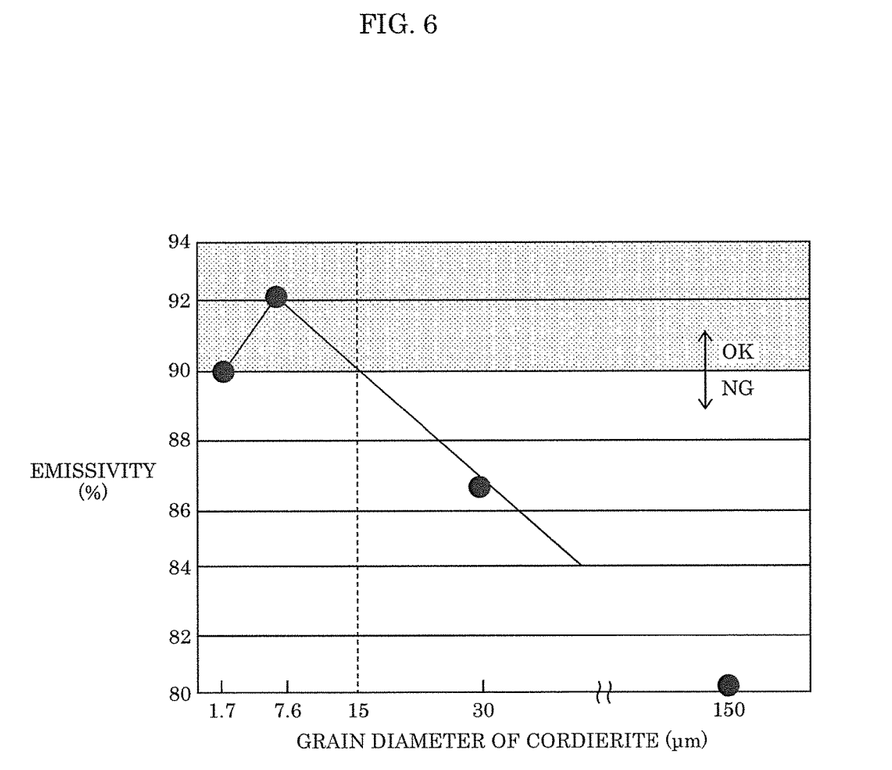
FIG. 6 graphs a relationship between the grain diameters and the emissivities of cordierite fillers according to Examples 1 and 2 and Comparative examples 2 and 3.

FIG. 6 graphs the relationship between the grain diameters and the emissivities of cordierite fillers according to the results of Examples 1 and 2 and Comparative examples 2 and 3. The emissivities were measured at the wavelength of 5 µm. The wavelength of 5 µm was selected due to the following reasons.

Many ceramics exhibit decrease in the emissivity approximately at the wavelength of 5 µm, in the wavelength range from 5 µm to 20 µm that greatly influences the heat dissipation ability. The alumina whose emissivity is graphed in FIG. 7 has such a phenomenon. The emissivities at the wavelength of 5 µm in the wavelength range from 5 µm to 20 µm tend to greatly differ depending on the substances.

Thus, the emissivities of 90% or higher at the wavelength of 5 µm were determined to be effective at dissipating heat.

As graphed in FIG. 6, the cordierite fillers each having a grain diameter smaller than or equal to 15 µm have the emissivities of 90% or higher, thus efficiently dissipating heat.

This was possible because the resin was highly filled with the cordierite fillers each having a grain diameter smaller than or equal to 15 µm and thermally cured with the fillers distributed over the surface of the resin layer without any precipitation of the fillers.

Furthermore, although the cordierite fillers solely have the emissivities of 90% or lower in the wavelength range from 5 µm to 11 µm, prepared heat-dissipating resin composition 1 mixed with the liquid EPT exhibited the emissivities of 90% or higher even in the wavelength range from 5 µm to 11 µm.

As described above, heat-dissipating resin composition 1 of the present disclosure mainly contained, in a liquid EPT having an emissivity of 80% or higher in the wavelength range from 5 µm to 20 µm, cordierite having a grain diameter of 15 µm or smaller and an aspect ratio of 3 to 10. Specifically, heat-dissipating resin composition 1 features having the emissivities of 90% or higher in the wavelength range from 5 µm to 20 µm.

This structure of heat-dissipating resin composition 1 enables an extremely high far-infrared emissivity, and superior handleability.

Heat-dissipating resin composition 1 not necessarily but in principle contains a reaction inhibitor, a coupling agent, and a catalyst for EPT. It would be better if heat-dissipating resin composition 1 not necessarily but contains a surface preparation agent.

Figure 4:
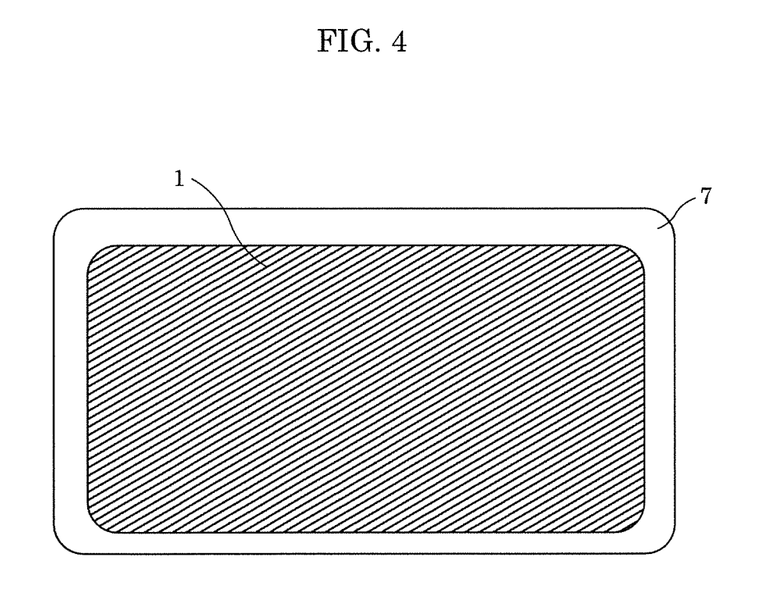
FIG. 4 illustrates an application of Example 1.

FIG. 4 illustrates an application of the present disclosure, showing that heat-dissipating resin composition 1 according to the embodiment, for example, has an extremely high far-infrared emissivity and a heat dissipation ability superior in handleability, and can dissipate heat of a heat-generating element to the outside and suppress the temperature rise. FIG. 4 illustrates heat-dissipating resin composition 1 and tablet inner part 7.

As such, heat-dissipating resin composition 1 is applicable to inner parts of compact, light, and thin smartphones and tablet PCs in which any fan or heat sink cannot be placed.

Furthermore, heat-dissipating resin composition 1 may be applied to the surface of a heat-generating device as illustrated in FIG. 2. FIG. 2 is a cross-sectional view of a heat-generating device (heat-generating component) including: a part; and heat-dissipating resin composition 1 that is disposed in a surface of the part. In FIG. 2, metal substrate 4 is used as a heat-generating device. Furthermore, heat-dissipating resin composition 1 may be placed on the surface of a heat sink or a heat-generating element. Here, metal substrate 4 is used as the part of heat-dissipating resin composition 1.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

Since the heat-dissipating resin composition according to the present disclosure is superior in heat dissipation ability, it is applicable to various components and electronic devices that include heat-generating elements.

What is claimed is:

1. A heat-dissipating resin composition comprising:
   a non-conjugated polyene copolymer rubber having an average emissivity of 80% or higher in a wavelength range from 5 µm to 20 µm;
   a cordierite filler having a grain diameter of 15 µm or smaller, a mass concentration ranging from 67% to 90% by mass, and an aspect ratio of 3 to 10; and
   a reaction inhibitor,
   wherein the heat-dissipating resin composition has an emissivity of 90% or higher at wavelengths of 5 µm, 15 µm and 20 µm.

2. The heat-dissipating resin composition according to claim 1,
   wherein the non-conjugated polyene copolymer rubber is an ethylene/propylene/non-conjugated polyene copolymer rubber.

3. The heat-dissipating resin composition according to claim 2,
   wherein the ethylene/propylene/non-conjugated polyene copolymer rubber has a molecular mass ranging from 750 to 2000.

4. The heat-dissipating resin composition according to claim 2,
   wherein the ethylene/propylene/non-conjugated polyene copolymer rubber contains 10% to 20% of a hydrocarbon oil by mass.

5. The heat-dissipating resin composition according to claim 2,
   wherein the ethylene/propylene/non-conjugated polyene copolymer rubber contains 0.5% to 0.8% of triallyl isocyanurate by mass.

6. The heat-dissipating resin composition according to claim 2,
   wherein the ethylene/propylene/non-conjugated polyene copolymer rubber contains 0.5% to 0.8% of a thixotropic agent by mass.

7. The heat-dissipating resin composition according to claim 1, wherein the cordierite filler has a grain diameter of 1.7 µm or larger and 15 µm or smaller.

8. The heat-dissipating resin composition according to claim 1, further comprising a crosslinker.

9. The heat-dissipating resin composition according to claim 1, further comprising a thixotropic agent.

10. The heat-dissipating resin composition according to claim 1, further comprising a catalyst.

11. The heat-dissipating resin composition according to claim 10, wherein the catalyst is for a non-conjugated polyene copolymer.

12. The heat-dissipating resin composition according to claim 1, further comprising a hydrocarbon oil as a plasticizer.

13. The heat-dissipating resin composition according to claim 1, further comprising a plasticizer and a crosslinker.

14. The heat-dissipating resin composition according to claim 13, wherein the crosslinker is triallyl isocyanurate.

15. A component comprising:
    a part; and
    the heat-dissipating resin composition according to claim 1 that is disposed in a surface of the part.

16. An electronic device comprising:
    a part; and
    the heat-dissipating resin composition according to claim 1 that is disposed in a surface of the part.

* * * * *